United States Patent
Wenham et al.

(10) Patent No.: US 8,962,979 B2
(45) Date of Patent: Feb. 24, 2015

(54) TRANSPARENT CONDUCTORS FOR SILICON SOLAR CELLS

(75) Inventors: Stuart Ross Wenham, Kyle Bay (AU); Budi Tjahjono, Kensington (AU); Ly Mai, Kensington (AU)

(73) Assignee: Newsouth Innovations Pty Limited (AU)

( * ) Notice: Subject to any disclaimer, the term of this patent is extended or adjusted under 35 U.S.C. 154(b) by 1855 days.

(21) Appl. No.: 11/916,686

(22) PCT Filed: Jun. 7, 2006

(86) PCT No.: PCT/AU2006/000778
§ 371 (c)(1),
(2), (4) Date: Dec. 22, 2008

(87) PCT Pub. No.: WO2006/130910
PCT Pub. Date: Dec. 14, 2006

(65) Prior Publication Data
US 2009/0183768 A1  Jul. 23, 2009

(30) Foreign Application Priority Data
Jun. 7, 2005 (AU) .................. 2005902954

(51) Int. Cl.
*H01L 31/00* (2006.01)
*H01L 31/068* (2012.01)
*H01L 31/18* (2006.01)
*H01L 31/0236* (2006.01)
*H01L 31/0224* (2006.01)

(52) U.S. Cl.
CPC ...... *H01L 31/022425* (2013.01); *H01L 31/068* (2013.01); *H01L 31/1804* (2013.01); *H01L 31/0236* (2013.01); *Y02E 10/547* (2013.01)
USPC .......................................... 136/256; 136/255

(58) Field of Classification Search
CPC ...................... H01L 31/022425; H01L 31/068
USPC .................................................... 136/256, 255
See application file for complete search history.

(56) References Cited

U.S. PATENT DOCUMENTS

| | | | | |
|---|---|---|---|---|
| 4,589,191 | A * | 5/1986 | Green et al. ..................... | 438/72 |
| 6,429,037 | B1 * | 8/2002 | Wenham et al. ................ | 438/57 |
| 2004/0261840 | A1 * | 12/2004 | Schmit et al. .................. | 136/258 |

FOREIGN PATENT DOCUMENTS

| | | |
|---|---|---|
| DE | 28 35 136 | 2/1980 |
| JP | 2005-123447 | 5/2005 |

OTHER PUBLICATIONS

English Translation of JP-2005-123447. Publication Date: May 12, 2005.*
PCT International Search Report & Written Opinion dated Aug. 16, 2006 issued in corresponding PCT International Appln. No. PCT/AU2006/000778 filed on Jun. 7, 2006.

* cited by examiner

*Primary Examiner* — Allison Bourke
(74) *Attorney, Agent, or Firm* — Ostrolenk Faber LLP

(57) ABSTRACT

A photovoltaic device is provided in which a contact structure is formed having a plurality of heavily doped semi-conductor channels formed on a surface of a region to be contacted. The heavily doped semiconductor channels are of the same dopant polarity as the region to be contacted, and form lateral conduction paths across the surface of the region to be contacted. Contact metallization comprising conductive fingers are formed over the surface of the region to be contacted, and each conductive finger crosses at least some of the heavily doped channels to make electrical contact therewith. The contact structure is formed by forming a layer of dopant source material over the surface to be contacted, and laser doping heavily doped channels in the surface to be contacted. The contact metallization is then formed as conductive fingers formed over the surface to be contacted and may be screen printed, metal plated or may be formed as buried contacts.

14 Claims, 3 Drawing Sheets

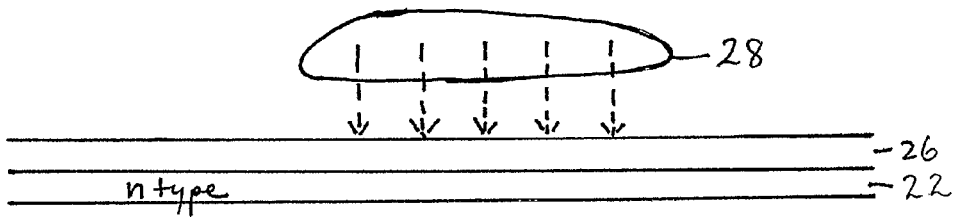
FIG. 3
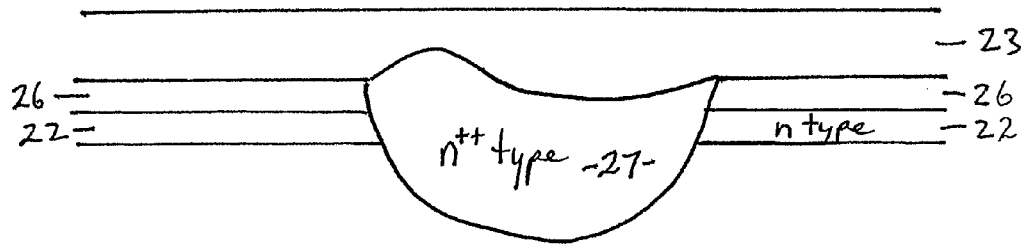
FIG. 4
FIG. 5

TRANSPARENT CONDUCTORS FOR SILICON SOLAR CELLS

CROSS REFERENCE TO RELATED APPLICATION

The present application is a 35 U.S.C. §§371 national phase conversion of PCT/AU2006/000778, filed Jun. 7, 2006, which claims priority of Australian Patent Application No. 2005902954, filed Jun. 7, 2005, the disclosure of which has been incorporated herein by reference. The PCT International Application was published in the English language.

INTRODUCTION

The present invention relates generally to the field of photovoltaics and in particular the invention provides an improved contact structure and an improved method of making contacts for solar cells.

BACKGROUND TO THE INVENTION

It is well recognised that high in performance photovoltaic cells there is a need to avoid heavily diffused surfaces where the light enters the cell, and preferably sheet resistivities above 100 ohms per square should be used in conjunction with good surface passivation. Conventional screen-printed solar cells cannot satisfy this requirement due to the need for the metal fingers to be spaced well apart and due to the need for heavy doping in the silicon to achieve good ohmic contact between the silicon and the metal. Both factors require emitter sheet resistivities well below the desired 100 ohms per square, with corresponding degraded electrical performance.

Referring to FIG. 1 a conventional screen-printed solar cell is illustrated in which the base region 11 of the silicon wafer is doped p-type and a heavily diffused $n^{++}$ emitter 12 is used to provide good conductivity in the surface region. Wide metal fingers 13 are formed over the surface to form the front surface metallisation, the fingers being spaced well apart and having a large metal/silicon interface area. A heavily doped p-type region 14 is provided at the rear of the base region 11 to provide a good interface with the rear contact metallisation 15. Screen-printed solar cell technology dominates commercial photovoltaic manufacturing, with well over 50% share of international markets. Despite the dominance of this technology, this solar cell design shown in FIG. 1, has significance performance limitations that limit the cell efficiencies to well below those achievable in research laboratories around the world. In particular, the front surface screen-printed metallisation 13 necessitates a heavily diffused emitter 12 to achieve low contact resistance and also to achieve adequate lateral conductivity in the emitter since the metal lines need to be widely spaced compared to laboratory cells to avoid excessive shading losses. Such cells therefore typically have emitters with sheet resistivities in the range of 40-50 ohms per square, which inevitably give significantly degraded response to short wavelength light. To raise this sheet resistivity to above 100 ohms per square as required for near unity internal quantum efficiencies for short wavelength light, serious resistive losses are introduced, both in the emitter 12 and by way of the contact resistance at the metal to n-type silicon interface.

To address this issue, researchers are endeavouring to develop improved screen-printing techniques that facilitate the achievement of narrower screen-printed metal lines (fingers) that can therefore be spaced more closely without excessive metal shading losses, while still allowing the use of emitter sheet resistivities approaching 100 ohms per square. An alternative approach which has been considered is to improve the lateral conductivity of the 100 ohms per square emitter, by coating it with a transparent conducting oxide such as zinc oxide or indium tin oxide. This approach gets used in some solar cell technologies such as amorphous silicon solar cells where the lateral conductivity is not high enough for the metal finger spacing being used. Such layers however tend to be expensive to produce reliably in production while simultaneously lowering the durability of the resulting product due to degradation in the electrical properties of such layers over long periods of time, particularly in the presence of moisture.

Another issue with the conventional design of FIG. 1 is that it has quite poor surface passivation in both the metallised and non-metallised regions. Even if good ohmic contacts could be made to more lightly doped emitters closer to 100 ohms per square, the large metal/silicon interface area would significantly limit the voltages achievable due to the high levels of recombination in these regions and hence contribution to the device dark saturation current. These voltage limitations have not been of major significance in the past due to the limitations imposed by the substrates. However, in the future as wafer thicknesses are reduced to improve the device economics, the cells will have the potential for improved open circuit voltages, but only provided the surfaces, including those under the metal, are sufficiently well passivated.

SUMMARY OF THE INVENTION

According to a first aspect, a photovoltaic device is provided in which a contact structure comprises a plurality of heavily doped semiconductor channels formed on a surface of a region to be contacted, and of the same dopant polarity as region to be contacted, which form lateral conduction paths across the surface of the region to be contacted, and contact metallisation comprising one or more conductive fingers formed over the surface of the region to be contacted, one or more of the conductive finger crossing at least some of the heavily doped channels to make electrical contact therewith.

According to a second aspect, a photovoltaic device is provided in which an emitter structure comprises a lightly doped semiconductor region of a second dopant polarity forming a thin surface layer over a base region of an oppositely doped semiconductor material, the lightly doped emitter region being traversed by a plurality of heavily doped semiconductor channels, of the same dopant polarity as the emitter, which form lateral conduction paths across the emitter region, and emitter surface metallisation of the photovoltaic device comprising one or more conductive fingers formed over the emitter layer, one or more of the conductive finger crossing at least some of the heavily doped channels to make electrical contact therewith. According to a third aspect, a photovoltaic device is provided in which a base contact structure comprises a base region of a first doped semiconductor material, a surface of the base region being traversed by a plurality of heavily doped semiconductor channels, of the same dopant polarity as the base region, which form lateral conduction paths across the base region, and base surface metallisation of the photovoltaic device comprising one or more conductive fingers formed over the base region, one or more of the conductive finger crossing at least some of the heavily doped channels to make electrical contact therewith.

According to a fourth aspect, a method of forming a contact structure in a photovoltaic device is provided, the method comprising forming a layer of dopant source material over the surface to be contacted, laser doping heavily doped channels in the surface to be contacted, which form lateral conduction paths across the surface to be contacted, and forming contact metallisation comprising one or more conductive fingers formed over the surface to be contacted, one or more of the conductive finger crossing at least some of the heavily doped channels to make electrical contact therewith.

In preferred embodiments, the contact metallisation comprises a plurality of conductive fingers formed over the surface of the region to be contacted, each conductive finger crossing at least some of the heavily doped channels to make electrical contact therewith.

Preferably also the plurality of heavily doped semiconductor channels are formed in the region to be contacted such that they extend inwardly from the surface of the region to be contacted and a surface of the heavily doped semiconductor channels does not significantly deviate from the surface of the region to be contacted. In the case of devices in which the surface of the region to be contacted is textured, the plurality of heavily doped semiconductor channels have an upper surface located substantially between upper and lower bounds of the textured surface.

In some instances the region to be contacted is a thin layer bounded by a differently doped layer and the plurality of heavily doped semiconductor channels extend through the region to be contacted and project into the layer bounding the region to be contacted.

In the case of an emitter surface the heavily doped channels may be formed after formation of the emitter layer and are of the same dopant type as the emitter layer but with a significantly heavier doping level, however it is also possible with some dopant sources to form the heavily doped channels first, before forming the rest of the emitter layer. The emitter layer is preferably formed by using the same dopant source as is used to form the heavily doped channels. In the case of a base surface, the heavily doped channels are formed with the same dopant type as the base but with a significantly heavier doping level.

Preferably, the contact fingers are oriented substantially perpendicularly to the direction of the heavily doped semiconductor channels, however other patterns are also possible and the channels and fingers may not be straight or may be formed in a criss-cross pattern for example and the fingers may cross the channels at an acute angle.

The preferred embodiment of the present invention is formed as a crystalline silicon solar cell having a p-type base and n type emitter, however the invention is equally applicable to silicon devices of opposite polarity, or silicon devices having an inverted structure with the p-n junction at the rear, as well as devices formed from other semiconductor materials.

Embodiments of the emitter structure use heavily doped channels formed as transparent conductors within the silicon itself in parallel with a lightly diffused emitter with the latter having a sheet resistivity in the range of 50 to 5,000 ohms per square. These heavily doped transparent conductors will preferably have sheet resistivities below about 40-50 ohms per square and preferably in the range of 1 to 20 ohms per square. These heavily doped transparent conductors within the silicon preferably run parallel to each other as shown in FIGS. 2 & 6 and carry current to the conductive fingers which will usually run perpendicularly to the heavily doped transparent conductors and make electrical contact to them where they intersect. These heavily doped transparent conductors within the silicon therefore alleviate the need for sheet resistivities below 100 ohms per square in the remainder of the emitter, therefore facilitating greatly improved response to short wavelength light compared to conventional screen printed solar cells of FIG. 1, provided the lightly diffused emitter surface regions are adequately passivated such as by silicon dioxide or silicon nitride.

Preferably, the conductive fingers are screen printed metal structures applied by conventional means however the use of heavily doped semiconductor conducting channels is equally applicable to other contact structures including plated metal contacts and buried contact structures.

Embodiments of the proposed emitter structure overcomes limitations of existing designs that use screen printed contacts, through the use of transparent heavily doped silicon conductors within the silicon wafer that carry current to the metal fingers which in general run perpendicularly to the transparent conductors as shown in FIG. 1. Provided such conductors are spaced less than about 1.2 mm apart, the remainder of the emitter can be doped to sheet resistivities above 100 ohms per square as desired for good performance to short wavelength light. A phosphorus doped surface dielectric layer on the silicon in conjunction with laser heating has been found to be an excellent way of forming the transparent conductors and also passivating the remainder of the surface.

BRIEF DESCRIPTION OF THE DRAWINGS

Embodiments of the proposed emitter contact structure and method of making a contact will now be described, by way of example with reference to the accompanying drawings in which:—

FIGS. 3, 4 & 5 show schematic cross section views (not to scale) of a device made with the proposed emitter contact structure in various stages of fabrication.

DETAILED DESCRIPTION OF THE PREFERRED EMBODIMENTS

Referring to FIGS. 2-6 of the Figs, a novel top surface design is illustrated in which dependence on uniformly heavily diffused emitters is removed, thereby improving performance in response to short wavelengths of light, when compared with previously available commercial cells. The embodiments described herein show crystalline silicon screen-printed solar cells.

Figure 2:
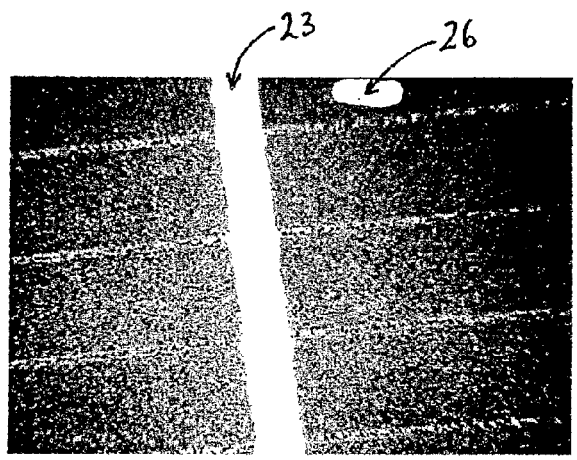
FIG. 2 shows a photograph of part of a cell constructed with the proposed emitter contact structure described.

FIG. 2 shows a photograph of a top surface of a solar cell with the proposed emitter contact structure in which laser doped transparent conductors 27 within the silicon (the approximately horizontal lines), spaced 0.5 mm apart and running substantially perpendicularly to the screen-printed metal fingers 23 (the approximately vertical line). The remainder of the silicon surface remains textured and is n-type doped to 100 ohms per square and is well passivated by a silicon nitride or silicon oxide dielectric layer 26 acting as an antireflection coating. The surface dielectric layer 26 is also doped with phosphorus to act as a phosphorus diffusion source.

FIG. 3 is a schematic cross-section illustrating the first stages in the fabrication of the proposed emitter design, in which the p type bulk base region 21 of a crystalline silicon wafer is capped with a phosphorous doped silicon oxide surface dielectric layer 26. By heating the structure of FIG. 3 (for example using a belt or quartz tube furnace) an n type emitter region 22 is formed as seen in FIG. 4. This emitter region can be formed with a sheet resistivity of 100 ohms per square or greater and preferably has a sheet resistivity of about 200 ohms per square. Using a laser 28 (as seen in FIG. 4) lines of silicon (and the overlying doped oxide) are melted and recrystallised to produce transparent heavily doped n type conductors 27 within the silicon (as seen in FIG. 5) and extending across the surface emitter region 22, (see FIG. 2) to provide high conductivity paths from the lightly doped emitter layer 22 to the metal contact fingers 23 formed over the surface. The metal contact fingers are typically aluminium and are applied by screen printing in a conventional manner.

This structure addresses fundamental limitations of screen-printed metal contacts with their inability to produce fine lines and make ohmic contact to lightly diffused emitters. In the preferred design, the heavily doped channels run perpendicularly to the metal fingers.

Figure 1:
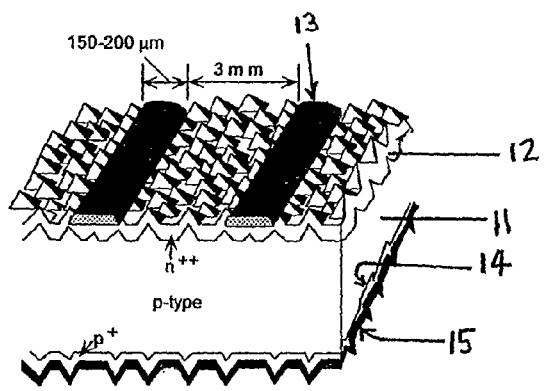
FIG. 1 schematically illustrates a conventional screen-printed solar cell with heavily diffused $n^{++}$ emitter, wide metal fingers spaced well apart and large metal/silicon interface area for the front surface metallisation.

In the proposed emitter contact structure, improved passivation under the metal fingers 23 is achieved firstly by locating a surface passivating dielectric 26 such as silicon dioxide or silicon nitride, or both, between the lightly diffused surface regions 22 and the metal fingers 23 during fabrication and secondly by ensuring that in the regions where the metal makes ohmic contact to the n type silicon (i.e. the conductive channels 27) that the resistivity of the $n^{++}$ silicon in the transparent conductive channels 27 is below that typically used in the $n^{++}$ emitter regions of conventional screen-printed solar cells like those of FIG. 1. This later requirement for the transparent conductive channels 27 will equate to sheet resistivities below about 40-50 ohms per square and preferably within the range of 1-20 ohms per square. As well as increasing the conductivity of the conductive channels 27, such heavy $n^{++}$ doping will also help reduce the contact resistance between the metal fingers and these transparent conductive channels 27 in the silicon, each of which has a beneficial effect on the overall series resistance of the cell.

The above described structure is a new approach for forming emitters for silicon solar cells that improves device performance by:
1. Significantly improving the response to short wavelength light by ensuring that almost all carriers generated in close proximity to the light receiving surface are able to contribute to the device photogenerated current. This yields a significant improvement in short circuit current, typically in the vicinity of 5-10% compared to conventional screen-printed solar cells.
2. Reducing the device parasitic series resistance losses by lowering the lateral resistance losses within the emitter and reducing the contact resistance losses through the very heavy doping of the transparent conductors where they make contact to the metal fingers.
3. Reducing the device dark saturation current and therefore increasing open circuit voltage by reducing the interface area between the metal and the silicon and ensuring that the silicon is very heavily doped in these regions. This will become increasingly more important in the future as the thickness of substrates is reduced and hence device voltages are limited more and more by surface recombination.
4. Reduced metal shading loss by capitalising on the lower effective sheet resistivity of the emitter in the direction perpendicular to the metal lines to more widely space the metal fingers compared to conventional screen-printed solar cells. This equates to higher short circuit currents for devices.
5. Improved post processing minority carrier lifetimes for some substrate materials that degrade under the high temperatures associated with the emitter formation of the conventional screen-printed solar cell of FIG. 1. For such devices, the improved post processing material quality that comes from the lower processing temperatures leads to improvements in both currents and voltages.
6. Improved edge junction isolation through there being less unwanted diffusion into the edges of the devices that creates an unwanted conduction path between the front and rear metal contacts.

Methods of Implementation of the Proposed Structure.

The transparent conductor channels can be formed within the silicon in a number of ways with a typical approach being to coat the wafer surface with a phosphorus containing compound and then heat the regions where the conducting lines are to be formed with a 532 nm wavelength (frequency doubled) NdYAG Q-switched laser. The laser power is chosen so as to melt, but not significantly ablate, the underlying silicon, therefore allowing large numbers of phosphorus atoms to be released into the molten silicon which subsequently recrystallises as heavily doped $n^{++}$ silicon. The phosphorus containing compound can be chosen from:
  i) one of a range of commercially available spin-on diffusion sources, (e.g. doped spin on glass);
  ii) commercially available solid sources which transfer $P_2O_5$ onto the wafer surface at elevated temperature;
  iii) $POCl_3$ liquid diffusion source by conventional techniques; or
  iv) a dielectric layer deposited in such a manner as to incorporate phosphorus into the layer such as silicon nitride by PECVD etc.; or
  v) an appropriate phosphorus containing compound such as phosphoric acid;

It is often advantageous to use the same phosphorus containing compound to firstly lightly diffuse the wafer top surface to the vicinity of 100 ohms per square and then subsequently use the laser as described to heat localised regions and so produce the transparent conductors. Such transparent conductors are typically in the range of 5-100 microns wide depending on the laser optics and laser type used. The benefit of doing the top surface diffusion first is that for some phosphorus containing compounds, the heat treatment acts to condition the layer so as to subsequently more effectively release the phosphorus when the silicon is melted by the laser. Without such appropriate conditioning/drying, some phosphorus containing compounds ablate prior to releasing sufficient phosphorus into the silicon.

Another important aspect of the laser processing in this step is that the surface layer of phosphorus containing compound can be damaged in such a way as to expose regions of the silicon surface or at the very least, reduce the thickness of the layer in some regions, so as to facilitate subsequent contact formation between the transparent conductor and the screen-printed metal.

Example of a Manufacturing Process Using the Invention
1. Saw damage removal by etching wafer surface (standard commercial process)
2. Texturing of wafer surface (standard commercial process)
3. Cleaning of wafer surfaces (standard commercial process)
4. Application of a phosphorus spin-on diffusion source followed by drying at 150° C. (standard commercial process)
5. Diffusion of top surface of wafer to about 200 ohms per square using a belt or quartz tube furnace, preferably using an oxygen ambient for at least the last part of the process so as to grow a surface passivating oxide for the silicon (standard commercial process)
6. Retain the spin-on diffusion source and use a 532 nm NdYAG laser on Q-switched mode to melt the silicon so as to laser dope the transparent conductors which are to cover the entire wafer surface spaced 0.7 mm apart except for a 1 mm wide border around the wafer perimeter.
7. Plasma edge junction isolate devices (standard commercial process)
8. Screen-print rear metal and dry (standard commercial process)
9. Screen-print front metal and dry (standard commercial process)
10. Fire front and rear metal contacts (standard commercial process).

As described above, 9 of the 10 processing steps closely resemble standard commercial processes used by manufacturers in the fabrication of conventional screen-printed solar cells. There are however many variations that can be used without to achieve the proposed structure. A common variation to improve the device performance is to replace the spin-on diffusion source with an antireflection coating such as silicon nitride that is either deposited containing phosphorus to enable it to act as a diffusion source or else is deposited onto a thin phosphorus containing compound/layer such as $P_2O_5$ In either case, step 6 above is subsequently used as described to form the transparent conductors. Regardless of the type of phosphorus containing dielectric used as the diffusion source, it is important in step 6 for the silicon to be heated by the laser or other heat source to above the silicon melting temperature of about 1400° C. This not only facilitates more phosphorus dopants penetrating deep into the silicon, but it also damages the overlying dielectric layer thereby facilitating better subsequent electrical contact between the screen-printed metal and the transparent conductors within the silicon.

Figure 6:
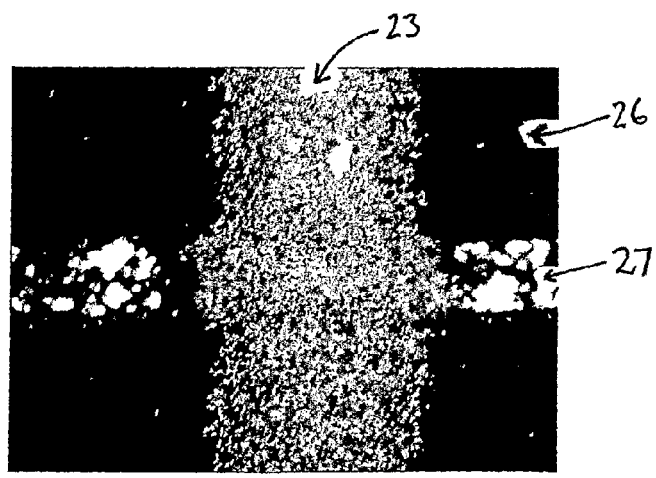
FIG. 6 is a photograph of a screen-printed metal line making excellent electrical contact to one of the heavily laser doped transparent conductors running perpendicular to the metal line and made according to the proposed emitter contact structure.

FIG. 6 is a photographic detail of the surface of a textured silicon wafer that has been coated with a phosphorus containing, dielectric layer 26 and then diffused to 100 ohms per square. The transparent conductors 27 (white horizontal line) were then formed parallel to each other with a spacing of 0.6 mm using laser heating. The vertical screen-printed metal line 23 of about 100 microns width forms a contact with the silicon wherever it crosses the transparent conductor but remains relatively isolated from the silicon in all the other surface regions where the silicon nitride antireflection layer 26 remains intact. The photograph in FIG. 6 is a detailed view of the screen-printed metal line 23 crossing one of the heavily laser doped transparent conductors 27 running perpendicular to the metal line and with which it makes excellent electrical contact. The surface reflection in the heavily laser doped transparent conductor regions 27 can be seen to have increased significantly due to the destruction of the surface pyramids when the silicon was melted and also because of the damage this also caused to the antireflection coating 26 which is still intact in the dark regions which are textured and lightly diffused to 100 ohms per square, and well passivated by the silicon nitride antireflection coating.

Figure 7:
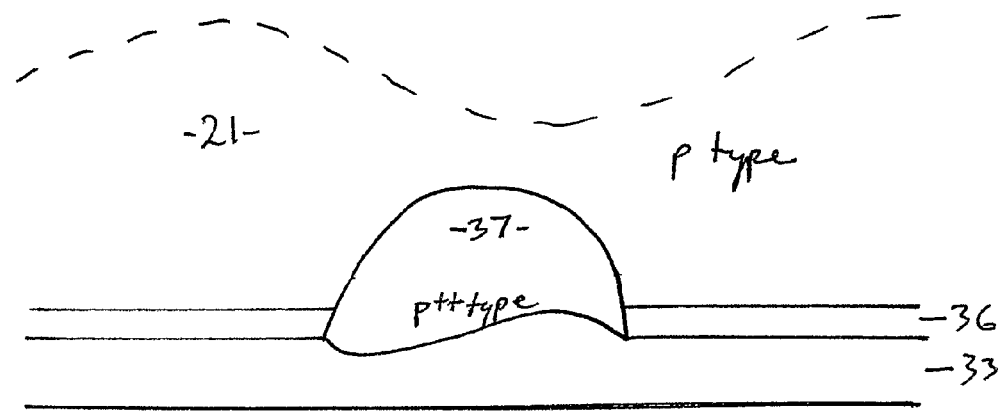
FIG. 7 shows a schematic cross section view (not to scale) of a device made with a base contact structure similar to the emitter contact structure seen in FIGS. 3, 4 & 5.
Figure 8:
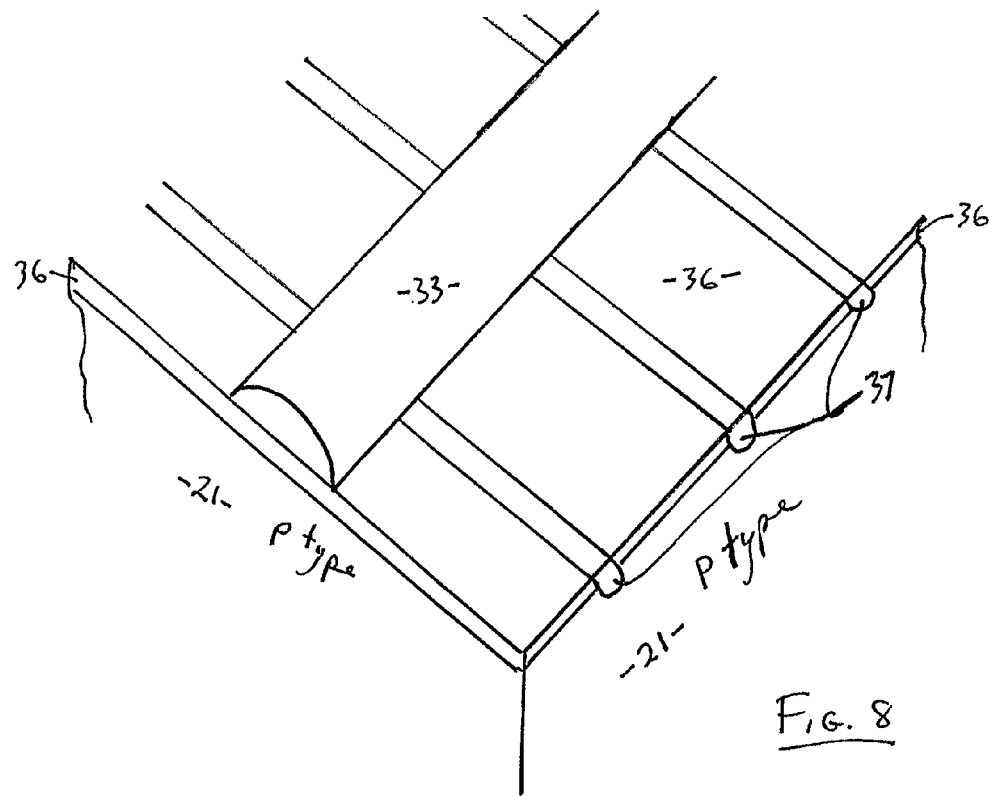
FIG. 8 shows a diagrammatic perspective view of the structure of FIG. 7.

Referring to FIGS. 7 & 8, another possible variation over conventional screen-printed solar cells is to also apply this technique to the rear surface of the wafer so as to improve the effective rear surface passivation while simultaneously producing a bifacial cell that can receive light entering the rear surface. In applying the invention to the rear surface of the wafer, the polarity of dopants used for laser doping the transparent conductors is opposite to the polarity used for the front surface transparent conductors. In FIGS. 7 & 8 it can be seen that by applying a p type dopant source layer 36 such as a doped spin on glass, conductive channels 37 can be formed by laser melting of the underlying silicon in a similar manner to that described above for the emitter case. This avoids having the entire back surface being heavily doped while providing high conductivity paths to the rear metallisation 33 and good passivation via correct selection of the dopant source. The rear metallisation 33 is formed as a series of fingers rather than a full layer enabling rear illumination of the cell.

The novel cell designs above have been described for n-type emitters and p-type substrates. The invention could be equally well implemented in the reverse polarities using a boron doped p-type emitter with p-type transparent conductors It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A photovoltaic device including a layer of dielectric material extending across a semiconductor surface of a region of the device to be contacted and a contact structure contacting the semiconductor surface and comprising a plurality of heavily doped semiconductor channels located in and on the semiconductor surface, and being of the same dopant type as the region to be contacted, the plurality of heavily doped semiconductor channels providing lateral conduction paths across the surface of the region to be contacted, and contact metallization comprising one or more conductive fingers extending across the surface of the region to be contacted and separated from the semiconductor surface by the layer of dielectric material, the layer of dielectric material having openings, wherein the heavily doped semiconductor channels are in the openings, and one or more of the conductive fingers crossing at least one of the heavily doped semiconductor channels to make electrical contact therewith through the openings in the layer of dielectric material.

2. The photovoltaic device as claimed in claim 1, wherein the contact metallization comprises a plurality of conductive fingers extending over the surface of the region to be contacted, each conductive finger crossing at least some of the heavily doped semiconductor channels to make electrical contact therewith.

3. The photovoltaic device as claimed in claim 1, wherein the plurality of heavily doped semiconductor channels are located in the region to be contacted such that they extend inwardly from the surface of the region to be contacted and a surface of the heavily doped semiconductor channels does not deviate from the surface of the region to be contacted.

4. The photovoltaic device as claimed in claim 1, wherein the surface of the region to be contacted is textured and the plurality of heavily doped semiconductor channels have an upper surface located substantially between upper and lower bounds of the textured surface.

5. The photovoltaic device as claimed in claim 1, wherein the region to be contacted is a thin layer bounded by a differently doped layer and the plurality of heavily doped semiconductor channels extend through the region to be contacted and project into the layer bounding the region to be contacted.

6. The photovoltaic device as claimed in claim 1, wherein the contact structure of the photovoltaic device comprises a base contact structure located in a base region of a first doped semiconductor material, the base contact structure being located in a surface of the base region such that the base region is traversed by the plurality of heavily doped semiconductor channels, of the same dopant polarity as the base region, which provide lateral conduction paths across the base region, and the contact metallization provides a base surface metallization of the photovoltaic device comprising the one or more of the conductive fingers being located over the base region, the one or more conductive fingers crossing at least one of the heavily doped semiconductor channels to make electrical contact therewith.

7. The photovoltaic device as claimed in claim 6, wherein the heavily doped semiconductor channels comprise heavily doped transparent conductors located within the first doped semiconductor material of the base region.

8. The photovoltaic device as claimed in claim 7, wherein the heavily doped semiconductor channels are of the same dopant type as the first doped semiconductor material of the base region and have a heavier doping level than the first doped semiconductor material of the base region.

9. The photovoltaic device as claimed in claim 1, wherein the contact structure of the photovoltaic device comprises an emitter structure in which a lightly doped semiconductor region of a second dopant polarity extends as a thin surface layer over a base region of an oppositely doped semiconductor material, and the contact structure is located in a surface of the lightly doped semiconductor region, such that the lightly doped semiconductor region is traversed by the plurality of heavily doped semiconductor channels, of the same dopant polarity as the lightly doped semiconductor region, which comprise the lateral conduction paths across the lightly doped semiconductor region, and the contact metallisation provides an emitter surface metallization of the photovoltaic device comprising the one or more conductive fingers which are located extending across the lightly doped semiconductor region, the one or more of the conductive fingers crossing at least one of the heavily doped semiconductor channels to make electrical contact therewith.

10. The photovoltaic device as claimed in claim 9, wherein the heavily doped semiconductor channels comprise transparent conductors in the lightly doped semiconductor region of the emitter structure and in parallel connection with the lightly doped semiconductor region.

11. The photovoltaic device as claimed in claim 10, wherein the heavily doped semiconductor channels are of the same dopant type as the lightly doped semiconductor region and having a heavier doping level than the lightly doped semiconductor region.

12. A photovoltaic device comprising a semiconductor of a first dopant type forming a base region, an emitter structure in which an emitter semiconductor region of opposite dopant type to the base region extends as a thin surface layer over the base region and a layer of dielectric material extends across a surface of the emitter semiconductor region, and wherein a contact structure is located in and on the surface of the emitter semiconductor region, such that the emitter semiconductor region is traversed by a plurality of heavily doped semiconductor channels, of the same dopant type as the emitter semiconductor region, which comprise lateral conduction paths across the emitter semiconductor region, the layer of dielectric material having openings, wherein the heavily doped semiconductor channels are in the openings, and the contact structure provides an emitter surface metallization of the photovoltaic device comprising one or more conductive fingers which are located extending across the emitter semiconductor region and separated from the emitter semiconductor region by the layer of dielectric material, the one or more conductive fingers crossing at least one of the heavily doped semiconductor channels to make electrical contact therewith.

13. The photovoltaic device as claimed in claim 12, wherein the heavily doped semiconductor channels comprise transparent conductors in the emitter semiconductor region of the emitter structure and in parallel connection with the emitter semiconductor region.

14. The photovoltaic device as claimed in claim 13, wherein the heavily doped semiconductor channels have a heavier doping level than the emitter semiconductor region.

\* \* \* \* \*